United States Patent
Forrest et al.

[11] Patent Number: 6,125,226
[45] Date of Patent: Sep. 26, 2000

[54] LIGHT EMITTING DEVICES HAVING HIGH BRIGHTNESS

[75] Inventors: Stephen R. Forrest; Paul Burrows; Dimitri Z. Garbuzov, all of Princeton, N.J.

[73] Assignee: The Trustees of Princeton University, Princeton, N.J.

[21] Appl. No.: 08/844,353

[22] Filed: Apr. 18, 1997

[51] Int. Cl.$^7$ .................................. G02B 6/10; H01J 1/62
[52] U.S. Cl. ........................... 385/131; 313/504; 313/506
[58] Field of Search .................................... 385/131, 901; 313/502–509

[56] References Cited

U.S. PATENT DOCUMENTS

| | | | |
|---|---|---|---|
| 5,294,870 | 3/1994 | Tang et al. | 313/504 |
| 5,663,573 | 9/1997 | Epstein et al. | 257/40 |
| 5,674,597 | 10/1997 | Fuji et al. | 428/212 |
| 5,834,893 | 11/1998 | Bulovic et al. | 313/506 |
| 5,994,835 | 11/1999 | Wilson et al. | 313/504 |

FOREIGN PATENT DOCUMENTS

WO 96/19792  6/1996  WIPO .

OTHER PUBLICATIONS

Burrows, P. et al., "Reliability and degradation of organic light emitting devices," Applied Phys. Lett., vol. 65, No. 23, Dec. 5, 1994, pp. 2922–2923.

Garbuzov, D. et al., "Organic films deposited on Si p–n junctions: Accurate measurements of fluorescence internal efficiency, and application to luminescent antireflection coatings," J. Appl. Phys., vol. 80, No. 8, Oct. 15, 1996, pp. 4644–4648.

Wu, C. et al., "Integrated three–color organic light–emitting devices," Appl. Phys. Lett., vol. 69, No. 21, Nov. 18, 1996, pp. 3117–3119.

Vestweber, H. et al., "Electroluminescence from polymer blends and molecularly doped polymers," Synthetic Metals 64 (1994), pp. 141–145.

Depp. S. et al., "Flat–Panel Displays," Scientific American, Mar. 1993, pp. 90–97.

Garbuzov, D. et al., "Photoluminescence efficiency and absorption of aluminum–tris–quinolate ($Alq_3$) thin films," Chemical Physics Letters 249 (1996), pp. 433–437.

Macleod, H., "Thin–Film Optical Filters," American Elsevier Publishing Company, Inc., New York (1969), pp. 94–110.

Burrows, P. et al., "Color–tunable organic light–emitting devices," Appl. Phys. Lett., vol. 69, No. 20, Nov. 11, 1996, pp. 2959–2961.

Adachi, C. et al., "Blue light–emitting organic electroluminescent devices," Appl. Phys. Lett., vol. 56, No. 9, Feb. 26, 1990, pp. 799–801.

Hosokawa, C. et al., "Highly efficient blue electroluminescence from a distyrylarylene emitting layer with a new dopant," Appl. Phys. Lett. 67, vol. No. 26, Dec. 25, 1995, pp. 3853–3855.

Johnson, C. et al., "Luminescent Iridium (I), Rhodium (I), and Platinum (II) Dithiolate Complexes," J. Am. Chem. Soc., vol. 105, No. 7, 1983, pp. 1795–1802.

*Primary Examiner*—Rodney Bovernick
*Assistant Examiner*—Juliana K. Kang
*Attorney, Agent, or Firm*—Kenyon & Kenyon

[57] ABSTRACT

Light emitting devices comprising a transparent substrate, a reflective layer on the substrate having at least one opening therein, a waveguiding layer on said reflective layer, and at least one OLED on the waveguiding layer for emitting light of a predetermined color. The light emitted from each OLED is directed through the at least one opening in the reflective layer for emission through the substrate.

44 Claims, 7 Drawing Sheets

LIGHT EMITTING DEVICES HAVING HIGH BRIGHTNESS

FIELD OF THE INVENTION

This invention relates to organic light emitting devices (OLEDs), and more particularly to OLEDs which are designed to concentrate emitted light for high brightness.

BACKGROUND OF THE INVENTION

Organic light emitting devices (OLEDs) make use of thin film materials which emit light when excited by electric current. Presently, the most favored organic emissive structure is referred to as the double heterostructure (DH) OLED, shown in FIG. 1A. In this device, a substrate layer of glass 10 is coated by a thin layer of a transparent, conductive oxide such as indium-tin-oxide (ITO) 11. Next, a thin (100–1000 Å) organic hole transporting layer (HTL) 12 is deposited on ITO layer 11. Deposited on the surface of HTL 12 is a thin (typically, 50 Å–1000 Å) emission layer (EL) 13. The EL 13 provides the recombination site for electrons injected from a 100–1000 Å thick electron transporting layer 14 (ETL) with holes from the HTL 12. Examples of prior art ETL, EL and HTL materials are disclosed in U.S. Pat. No. 5,294,870, the disclosure of which is incorporated herein by reference.

Often, the EL 13 is doped with a highly fluorescent dye to tune color and increase the electroluminescent efficiency and lifetime of the OLED. The device as shown in FIG. 1A is completed by depositing metal contacts 15, 16 and top electrode 17. Contacts 15 and 16 are typically fabricated from indium or Ti/Pt/Au. Electrode 17 is often a dual layer structure consisting of an alloy such as Mg/Ag 17' directly contacting the organic ETL 14, and a thick, high work function metal layer 17" such as gold (Au) or silver (Ag) on the Mg/Ag. The thick metal 17" is opaque. When proper bias voltage is applied between top electrode 17 and contacts 15 and 16, light emission occurs from emissive layer 13 through the glass substrate 10.

Another known organic emissive structure referred to as a single heterostructure (SH) is shown in FIG. 1B. The difference between this structure and the DH structure is that multifunctional layer 13' serves as both EL and ETL. One limitation of the device of FIG. 1B is that the multifunctional layer 13' must have good electron transport capability. Otherwise, separate EL and ETL layers should be included as shown for the device of FIG. 1A.

Yet another known LED device is shown in FIG. 1C, illustrating a typical cross sectional view of a single layer (polymer) OLED. As shown, the device includes a glass substrate 1 coated by a thin ITO layer 3. A thin organic layer 5 of spin-coated polymer, for example, is formed over ITO layer 3, and provides all of the functions of the HTL, ETL, and EL layers of the previously described devices. A metal electrode layer 6 is formed over organic layer 5. The metal is typically Mg, Ca, Li or other conventionally used low work function metal.

An example of a multicolor electroluminescent image display device employing organic compounds for light emitting pixels is disclosed in U.S. Pat. No. 5,294,870. This patent discloses a plurality of light emitting pixels which contain an organic medium for emitting blue light. Fluorescent media are positioned between the blue OLED and the substrate in certain parts of the pixels. The fluorescent media absorb light emitted by the blue OLED and emit red and green light in different regions of the same pixel.

In general, light emission brightness in conventional OLED technology can be somewhat limited. The ability to achieve higher brightnesses would expand the number of potential applications for this technology. Additionally, in conventional OLED light emitting devices there is a loss of light that is waveguided within device layers, such as the substrate or OLED layers. There thus exists the need for a high brightness OLED light emitting device in which the problem of lost waveguided light is minimized.

SUMMARY OF THE INVENTION

The present invention includes both monochromatic and multicolor light emitting devices. The light emitting devices of the present invention each comprise a transparent substrate, a reflective layer on the substrate, a waveguiding layer on the reflective layer, and at least one OLED on the waveguiding layer, each OLED for emitting light of a predetermined color. The reflective layer has at least one opening therein. The light emitted from the OLED(s) is reflected off of the waveguiding layer side walls and the reflective layer, such that it is directed through the opening in the reflective layer for emission through the substrate.

In a first embodiment of the invention, the waveguiding layer has a top surface, a bottom surface, and at least three sides, with one of the sides being at an angle of less than 90° with respect to said substrate and the remainder of the sides being perpendicular to the substrate. Light emitted from the OLED(s) is reflected off of the reflective layer and the sides of the waveguiding layer. The emitted light is therefore concentrated and directed through the opening in the reflective layer for emission through the substrate.

In a second embodiment of the invention, the waveguiding layer has a top surface, a bottom surface, and at least three sides, with at least two of the sides being at an angle of less than 90° with respect to the substrate and the remainder of the sides being perpendicular to the substrate. The reflective layer has openings which are positioned below the sides of the waveguiding layer which are at an angle of less than 90° with respect to the substrate. In this embodiment, light emitted from the OLED(s) is reflected off of the reflective layer and the sides of the waveguiding layer. The emitted light is therefore concentrated and directed through the openings in the reflective layer for emission through the substrate and convergence to a common focal point.

In any embodiment of the present invention, reflectors can be used on the sides of the waveguiding layer to enhance the reflection of emitted light.

One advantage of the present invention is that it provides monochromatic and multicolor light emitting devices with enhanced efficiency.

Another advantage of the present invention is that it redirects waveguided light into a concentrated beam.

Another advantage of the present invention is that it provides light emitting devices which are capable of producing high intensity, high brightness light beams.

Yet another advantage of the present invention is that it concentrates the light emitted from an OLED of relatively large length and concentrates such light into a relatively small emission area.

DETAILED DESCRIPTION

The light emitting devices of the present invention each comprise a transparent substrate, a reflective layer on the substrate, a waveguiding layer on the reflective layer, and at least one OLED on the waveguiding layer, each OLED for emitting light of a predetermined color. The reflective layer has at least one opening therein. The light emitted from the OLED(s) is reflected off of the waveguiding layer side walls and the reflective layer, such that it is directed through the opening in the reflective layer for emission through the substrate. In this way, the light generated by an OLED of a relatively large length is concentrated into a relatively small emission area. The result is a high brightness, high resolution light emitting device.

Figure 1A:
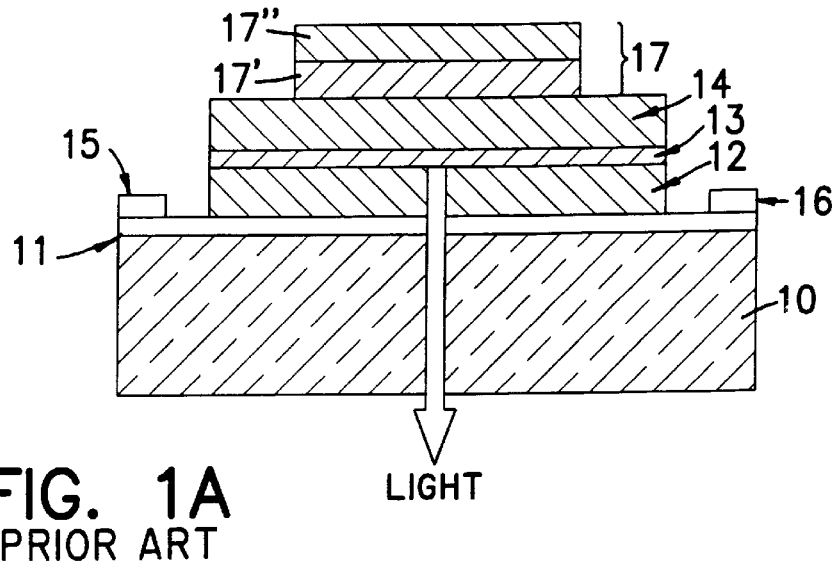
FIG. 1A is a cross sectional view of a typical organic double heterostructure light emitting device (OLED) according to the prior art.
Figure 1B:
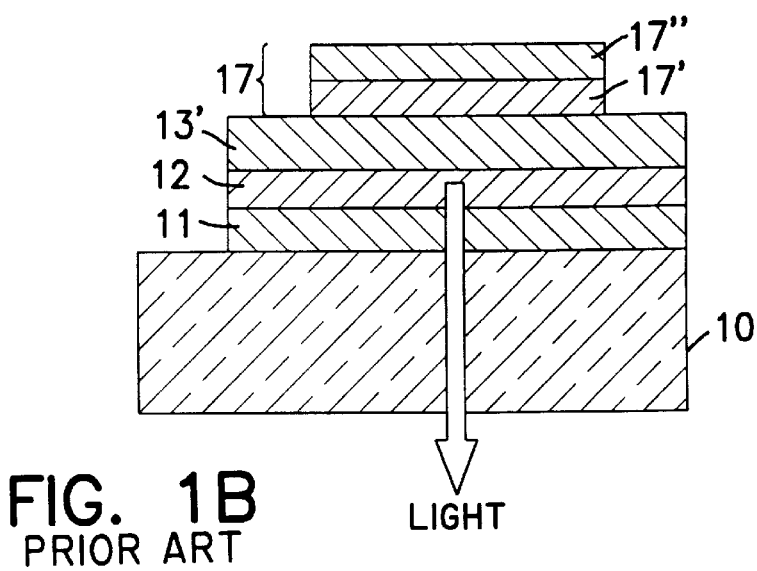
FIG. 1B is a cross sectional view of a typical organic single heterostructure light emitting device (LED) according to the prior art.
Figure 1C:
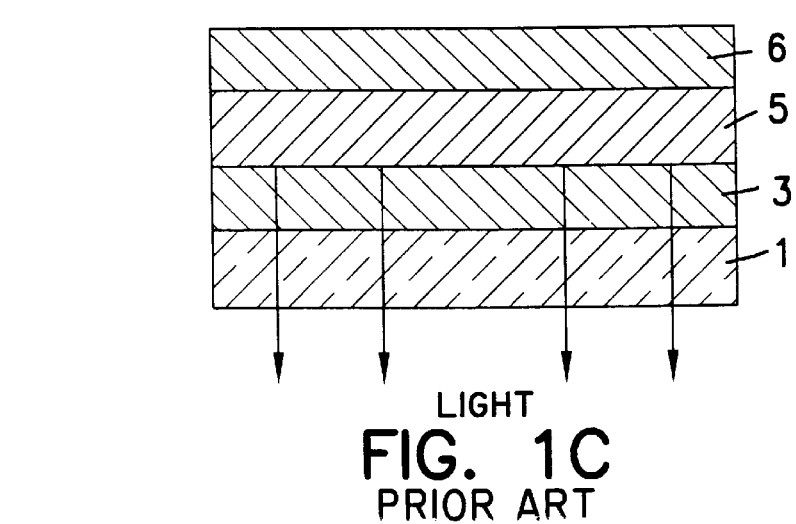
FIG. 1C is a cross sectional view of a known single layer polymer LED structure according to the prior art.
Figure 2A:
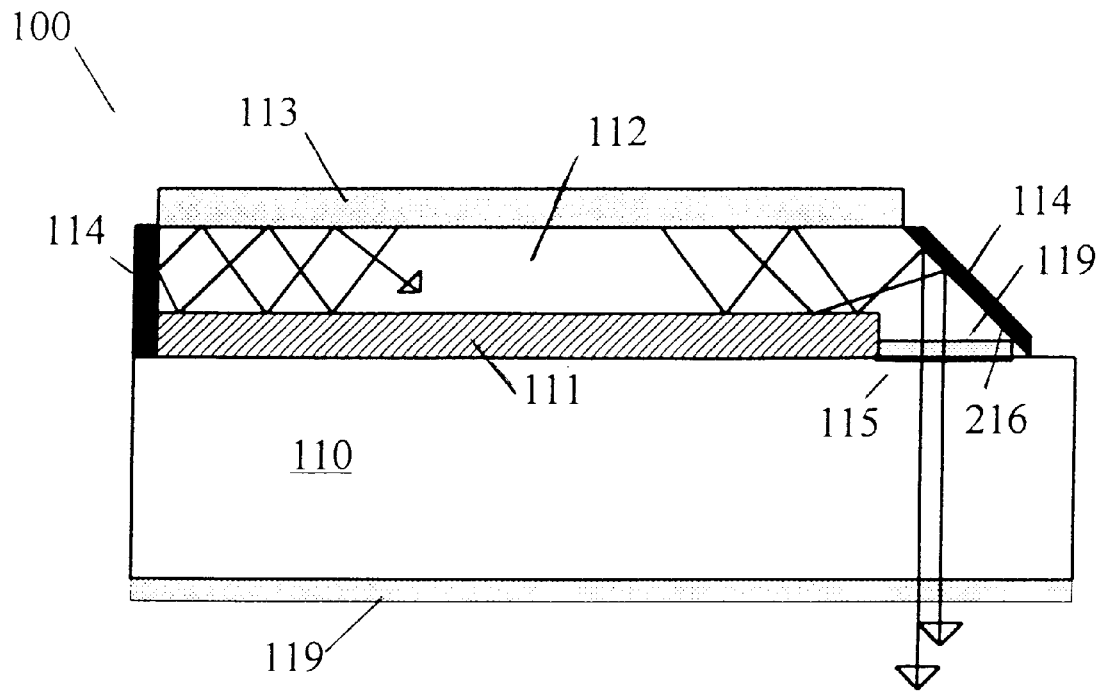
FIGS. 2A and 2B are cross-sectional view and top view, respectively, of a first embodiment of the present invention.
Figure 2B:
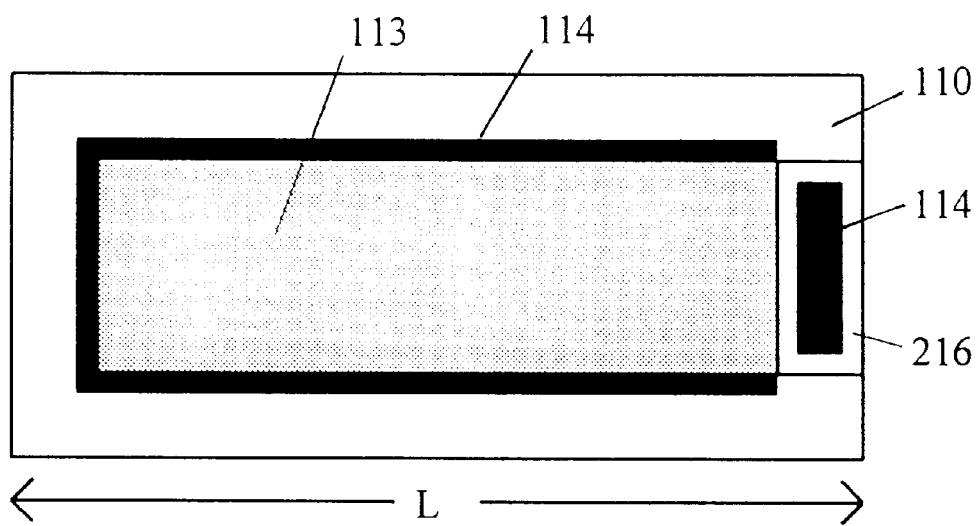

A first embodiment of the present invention is shown in FIGS. 2A and 2B. Light emitting device 100 comprises substrate 110, reflective layer 111, waveguiding layer 112 and OLED layer 113. Waveguiding layer 112 has at least one opening 115 therein to allow for the passage of light emitted from OLED layer 113. In this embodiment, waveguiding layer 112 has a top surface, a bottom surface, and at least three sides. One of the sides 216 of waveguiding layer 112 forms an angle of less than 90°, preferably about 45°, with respect to substrate 110. The remaining sides of waveguiding layer 112 are perpendicular to substrate 110. Reflectors 114 are optional on side 216, and are preferable on the remaining sides of waveguiding layer 112.

In the embodiment shown in FIGS. 2A and 2B, light emitted from OLED layer 113 is waveguided within waveguiding layer 112, where it reflects off of reflective layer 111 and the sides of waveguiding layer 112 such that it is directed through opening 115. The result is a concentrated beam of light which passes through opening 115 and substrate 110.

Figure 2C:
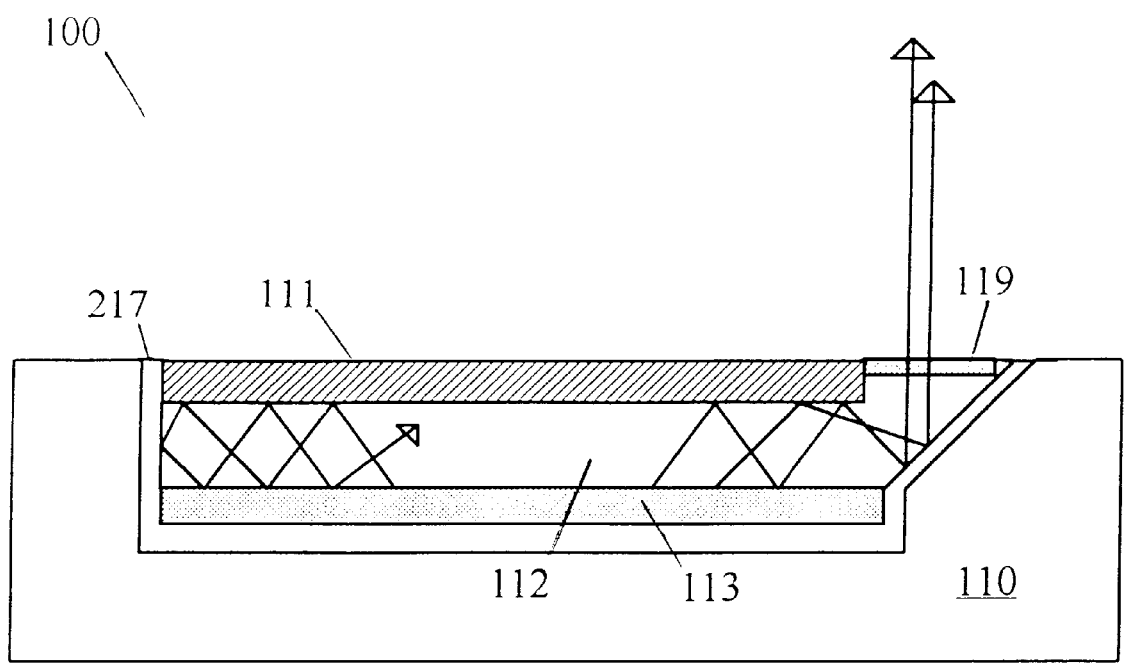
FIG. 2C is a cross-sectional view of an inverted version of the device shown in FIG. 2A.

Although the embodiment shown in FIGS. 2A and 2B is depicted as directing light through substrate 110, the invention also includes "inverted" configurations such as that shown in FIG. 2C. In such a configuration, the device is arranged in a patterned substrate with pits therein such that light is directed in a direction away from the substrate. If the substrate in such devices is not reflective, a layer of reflective material 217 should be included between OLED 113 and substrate 110. The depth of the pits in the patterned substrate can be relatively shallow, on the order of 1000–3000 Å, and as wide as desired. For example, patterned substrate 60 can be made of Si having the pits therein formed by a standard directional etching process.

Figure 3A:
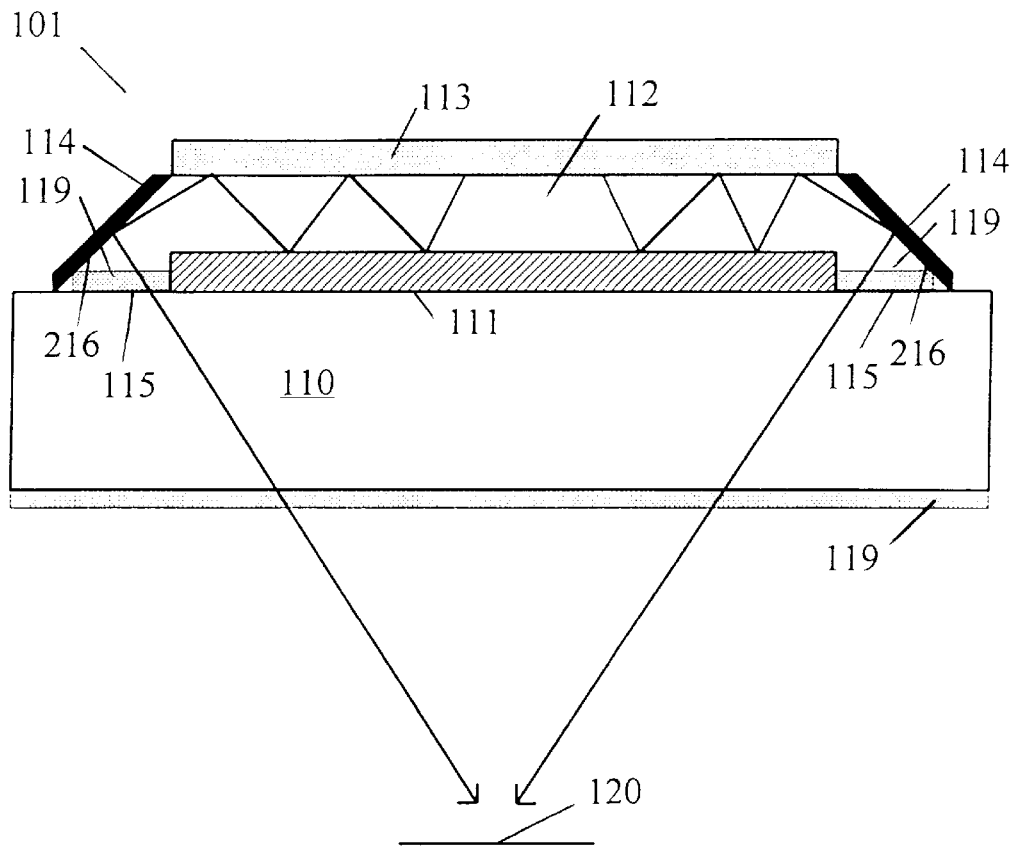
FIGS. 3A and 3B are cross-sectional view and top view, respectively, of a second embodiment of the present invention.
Figure 3B:
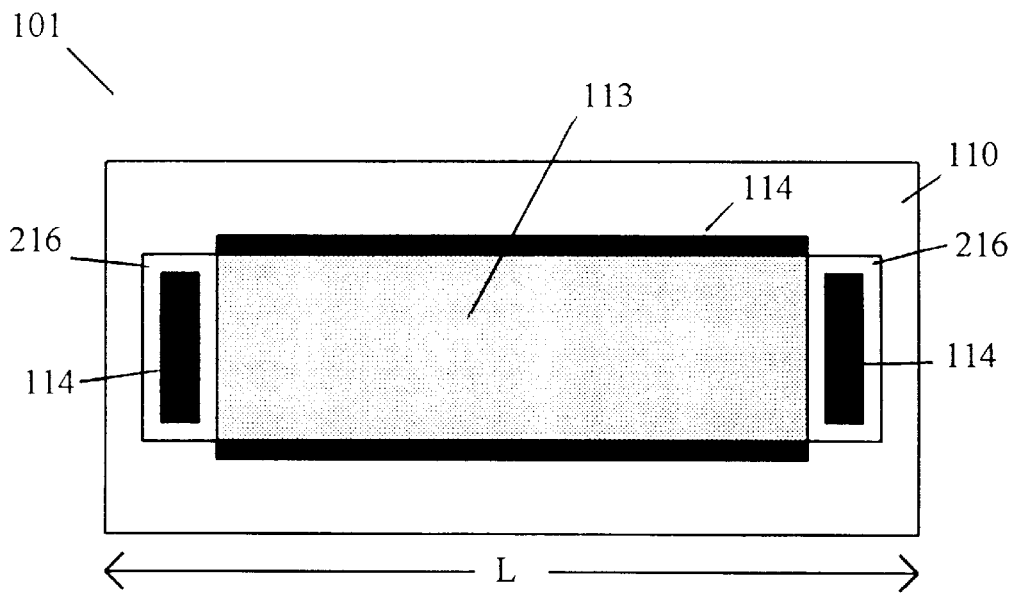

A second embodiment of the present invention is shown in FIGS. 3A and 3B. Light emitting device 101 comprises substrate 110, reflective layer 111, waveguiding layer 112 and OLED layer 113. At least two of the sides 216 of waveguiding layer 112 are at an angle of less than 90°, preferably about 30°, with respect to the substrate and the remainder of the sides are perpendicular to the substrate. Reflective layer 111 has openings therein which are positioned below the sides of waveguiding layer 112 which are at an angle of less than 90° with respect to the substrate. As shown in FIG. 3A, light emitted from OLED layer 113 is waveguided within waveguiding layer 112, where it reflects off of reflective layer 111 and the sides of waveguiding layer 112 such that it is directed through openings 115. Light emitting device 101 optionally includes reflectors 114 to aid in the reflection of light emitted from OLED layer 113. The light emerging from openings 115 of device 101 converges at some focal point 120.

In any embodiment of the present invention, substrate 110 is generally fabricated from a transparent material, such as glass, quartz, sapphire or plastic. Reflectors 114 can be metallic mirrors or multilayer dielectric stacks, the latter of these being preferred because metallic mirrors can be lossy. If metallic mirrors are used, reflectors 114 can be made from any suitable metal or alloy, preferably aluminum, silver, magnesium-aluminum alloy, and combinations thereof. If multilayer dielectric stacks, reflectors 114 can be made of any pair of dielectric materials having different refractive indices, such as $TiO_2$ and $SiO_2$, as is known in the art. Reflective layer 111 is made of a highly reflective multilayer dielectric stack.

Figure 4:
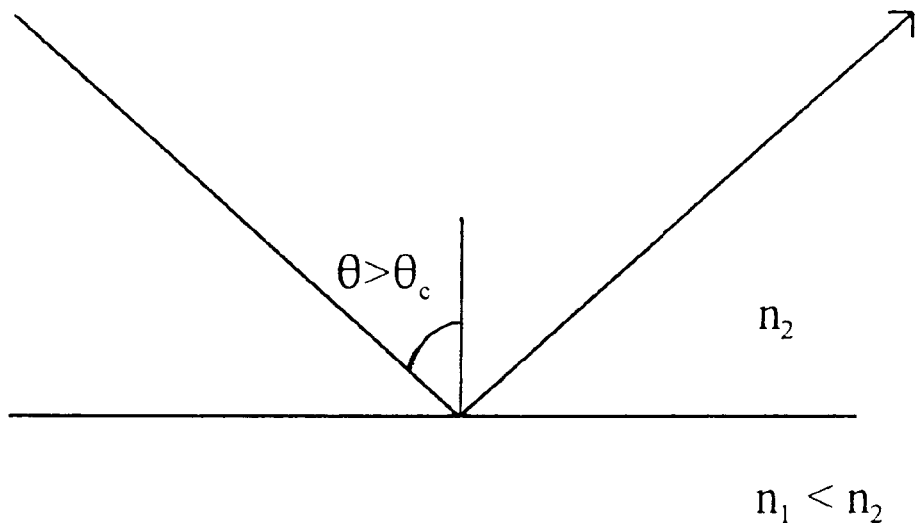
FIG. 4 schematically illustrates $\theta > \theta_c$, the critical angle for internal reflection.
Figure 4:
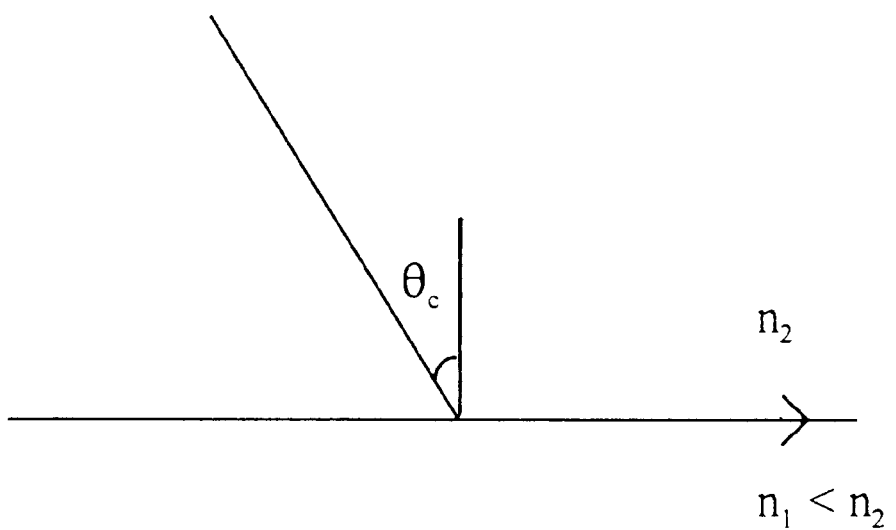

The need for optional reflectors 114 depends on the material used for waveguiding layer 112, which can be any suitable transparent dielectric material such as $SiO_2$, polyimide or TEFLON. Optimally, light which impinges on the angled walls of waveguiding layer 112 is completely reflected, thus resulting in total internal reflection. If this cannot be achieved because of the material used for waveguiding layer 112, however, reflectors 114 become necessary. For example, the material used for waveguiding layer and the material (or environment) surrounding waveguiding layer will have characteristic indices of refraction, $n_2$ and $n_1$, respectively. The critical angle, $\theta_c$, shown in FIG. 4 and defined as the minimum angle at which total internal reflection will occur, relates to $n_2$ and $n_1$ according to the equation $\sin(\theta_c) = (n_1/n_2)$, where $n_1 < n_2$. It can therefore be seen that as $n_2$, the refractive index of waveguiding layer 112, increases, $\theta_c$, decreases for a constant $n_1$ which is less than $n_2$. Accordingly, when the refractive index of waveguiding layer 112 is much greater than that of the surrounding material (or environment), $\theta_c$ is minimized such that internal reflection becomes more likely. In this case, reflectors 114 may not be necessary. Conversely, when $n_2$ is similar to $n_1$, $\theta_c$ is maximized such that internal reflection becomes less likely, and reflectors 114 may therefore become necessary.

Although reflectors 114 are shown as flat and straight members in the drawings, they may be of different shapes. For example, reflectors 114 can be curved or parabolic in shape to have a focussing effect on impinging light beams.

In any embodiment of the present invention, OLED layer 113 can be an OLED of single or double heterostructure configuration, as is known in the art. For simplicity, the OLEDs used in the present invention are shown as single layers in the drawings even though each OLED actually comprises multiple sub-layers if the OLED is not a single-layer polymer, as is known in the art. In addition, there are numerous electrode layers required for the operation of OLED layer 113, as shown in FIGS. 5A–5C.

Figure 5A:
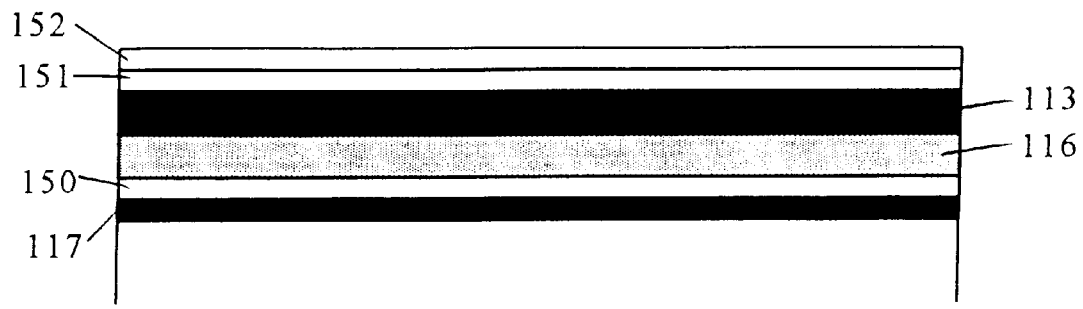
FIGS. 5A–5C illustrate some OLED variations which can be used in accordance with the present invention.

As shown in FIG. 5A, a low work function (preferably, <4 eV) metal layer 151 is formed on top of OLED layer 113. Suitable candidates for metal layer 151 include Mg, Mg/Ag, and Li/Al. Metal layer 151 serves as a contact material for OLED layer 113 and as a reflective material for reflection of impinging light beams. Deposited on the top of metal layer 151 is another conductive layer 152 suitable for forming an electrical contact. Conductive layer 152 can be made of ITO, Al, Ag or Au, for example. Light emission from the OLED 113 occurs when a voltage is applied between conductive layer 150 and conductive layer 152, thereby causing emission from the EL of OLED layer 113. A layer of phosphor 116 may optionally be included for light energy down conversion of the light emitted from the OLED emission layer to a desired color. The embodiment shown in FIG. 5A will produce monochromatic light emission.

Figure 5B:
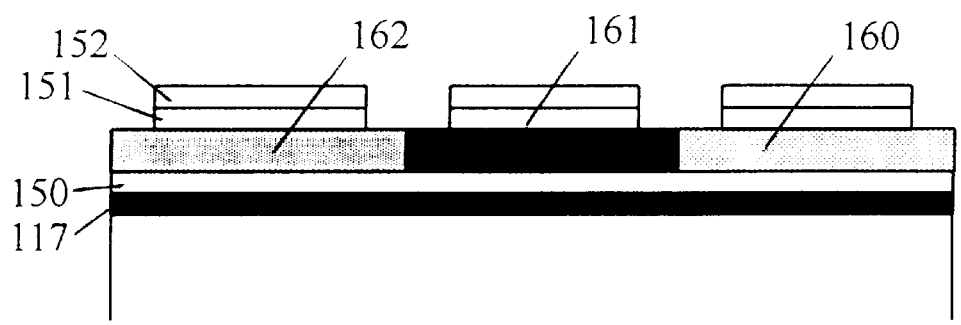

Alternatively, to facilitate multicolor applications, OLED layer 113 can include a blue OLED 160, a green OLED 161, and a red OLED 162 as shown in FIG. 5B. Each of the blue, green, and red OLEDs can be individually addressed for the independent emission of blue, green, and red light, respectively.

Figure 5C:
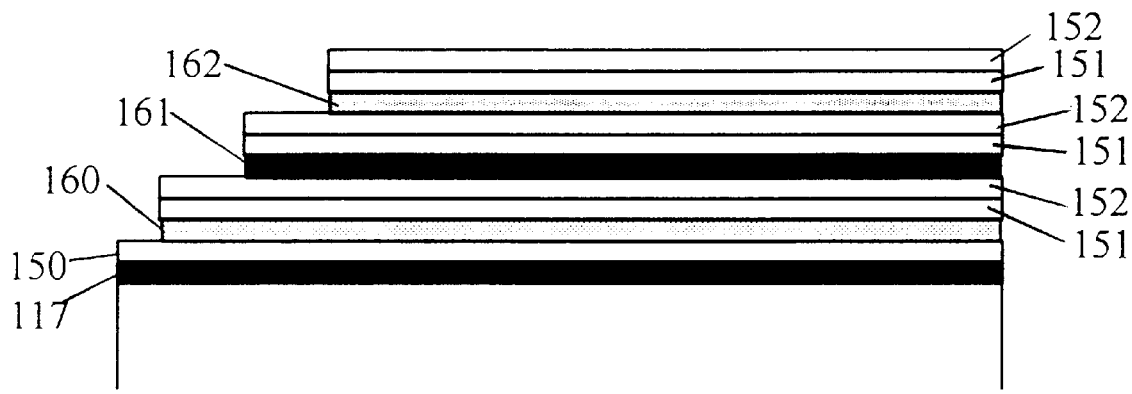

In a further embodiment of the present invention, blue, green and red OLED are arranged in a stacked configuration as shown in FIG. 5C. Such a stacked arrangement is described in co-pending U.S. application Ser. No. 08/354,674, now U.S. Pat. No. 5,707,745 filed Dec. 13, 1994, and PCT International Application Publication No. WO 96/19792, filed Dec. 6, 1995, the disclosures of which are incorporated herein by reference. In the embodiment shown in FIG. 5C, blue 160, green 161 and red 162 OLED's are stacked one upon the other, with each OLED separated one from the other by layers 151 and 152 to enable each device to receive a separate bias potential to emit light through the stack. In this embodiment, metal layers 152 which are positioned between OLED materials (e.g., between layers 160 and 161, and between layers 161 and 162) are thin enough to be transparent, and metal layer 152 on top of the red OLED 162, being the topmost conductive layer in the device, is thick enough to reflect impinging light beams. Each OLED 160, 161 and 162 may be of either SH or DH type, as previously described. As shown in FIG. 5C, the stacked arrangement of OLED's 160, 161 and 162 is positioned on conductive layer 150.

Blue OLED layer 160 can be made from any suitable blue light-emissive organic compounds such as, for example, trivalent metal quinolate complexes, Schiff base divalent metal complexes, metal acetylacetonate complexes, metal bidentate ligand complexes, bisphosphonates, metal maleonitriledithiolate complexes, molecular charge transfer complexes, aromatic and heterocyclic polymers and rare earth mixed chelates. The metal bidentate complexes which may be used for layer 160 have the formula $MDL_2^4$ wherein M is selected from trivalent metals of Groups 3–13 of the Periodic Table and Lanthanides. The preferred metal ions are $Al^{+3}$, $Ga^{+3}$, $In^{+3}$ and $Sc^{+3}$. D is a bidentate ligand such as 2-picolylketones, 2-quinaldylkentones and 2-(o-phenoxy) pyridine ketones. The preferred groups for $L^4$ include acetylacetonate, compounds of the formula $OR^3R$ wherein $R^3$ is selected from Si and C, and R is selected from hydrogen, substituted and unsubstituted alkyl, aryl and heterocyclic groups; 3,5-di(t-bu) phenol; 2,6-di(t-bu) phenol; 2,6-di(t-bu) cresol; and $H_2Bpz_2$. By way of example, the wavelength resulting from measurement of photoluminescence in the solid state of aluminum (picolymethylketone) bis [2,6-di(t-bu) phenoxide] is 420 nm. The cresol derivative of this compound also measured 420 nm. Aluminum (picolylmethyl-ketone) bis $(OsiPh_3)$ and scandium (4-methoxy-picolyl-methylketone) bis (acetylacetonate) each measured 433 nm, while aluminum [2-(O-phenoxy) pyridine] bis [2,6-di(t-bu) phenoxide] measured 450 nm.

Examples of green OLED materials include tin (iv) metal complexes, such as those having the formula $SnL_2^1 \ L_2^2$ where $L^1$ is selected from salicylaldehydes, salicyclic acid or quinolates (e.g. 8-hydroxyquinoline). $L^2$ can be substituted and unsubstituted alkyl, aryl and heterocyclic groups. When $L^1$ is a quinolate and $L^2$ is a phenyl, for example, the tin (iv) metal complex will have an emission wavelength of 504 nm.

Examples of red OLED materials include divalent metal maleonitriledithiolate ("mnt") complexes, such as those described by C. E. Johnson et al. in "Luminescent Iridium (I), Rhodium(I), and Platinum(II) Dithiolate Complexes," 105 *Journal of the American Chemical Society* 1795 (1983). For example, the mnt [Pt $(Pph_3)_2$] has a characteristic wavelength emission of 652 nm.

Additional OLED materials are known in the art (see, e.g., U.S. Pat. No. 5,294,870 to Tang et al., entitled "Organic Electroluminescent Multicolor Image Display Device"; Hosokawa et al., "Highly efficient blue electroluminescence from a distyrylarylene emitting layer with a new dopant," 67 *Applied Physics Letters* 3853–55 (December 1995); Adachi et al., "Blue light-emitting organic electroluminescent devices," 56 *Applied Physics Letters* 799–801 (February 1990); Burrows et al., "Color-Tunable Organic Light Emitting Devices," 69 *Applied Physics Letters* 2959–61 (November 1996)). The entire disclosures of these references are hereby incorporated by reference. Distyrylarylene derivatives such as those described in Hosokawa et al. are a preferred class of compounds. Other preferred OLEDs are described in the copending applications discussed below.

In order to minimize internal losses, it is preferable that waveguiding layer 112 should have a higher index of refraction than conductive layers 150. In addition, the refractive index of waveguiding layer 112 should be higher than that of the substrate in order to avoid leakage of light from waveguiding layer 112 though reflective layer 111 and into substrate 110. Furthermore, the light emitting devices of the present invention can optionally comprise a layer 117 of low-loss, high refractive index dielectric material, such as $TiO_2$, beneath conductive layers 150. Layer 117 is especially preferred when conductive layers 150 are made from ITO, which is a high-loss material such that it can absorb light emitted from OLED layer 113. The refractive indexes for $TiO_2$ and ITO are approximately 2.6 and 2.2, respectively. Layer 117 therefore substantially eliminates waveguiding and absorption in the ITO. Although the refractive index of layer 117 should be greater than that of layer 150, it should be less than the refractive index of waveguiding layer 112 so that the emitted light can easily pass from layer 117 to layer 112. In yet a further effort to reduce internal losses, a layer 119 of low-loss, high refractive index dielectric material can be positioned at openings 115 to serve as an antireflection coating to help facilitate the transmission of light from waveguiding layer 112 into substrate 110. Layer 119 can also be positioned under substrate 110 as shown in FIGS. 2A and 3A. Layer 119 can be TEFLON, for example.

The deposition techniques for any of the above-listed methods are well-known in the art. For example, the preferred method of depositing the OLED layers is by thermal evaporation or spin coating; the preferred method of depositing metal layers is by thermal or electron-beam evaporation or sputtering; the preferred method of depositing ITO is by electron-beam evaporation or sputtering; the preferred method of depositing the phosphor layers is by thermal evaporation or sputtering; and the preferred method of depositing dielectrics is by plasma-enhanced chemical vapor deposition or electron-beam evaporation.

Figure 6A:
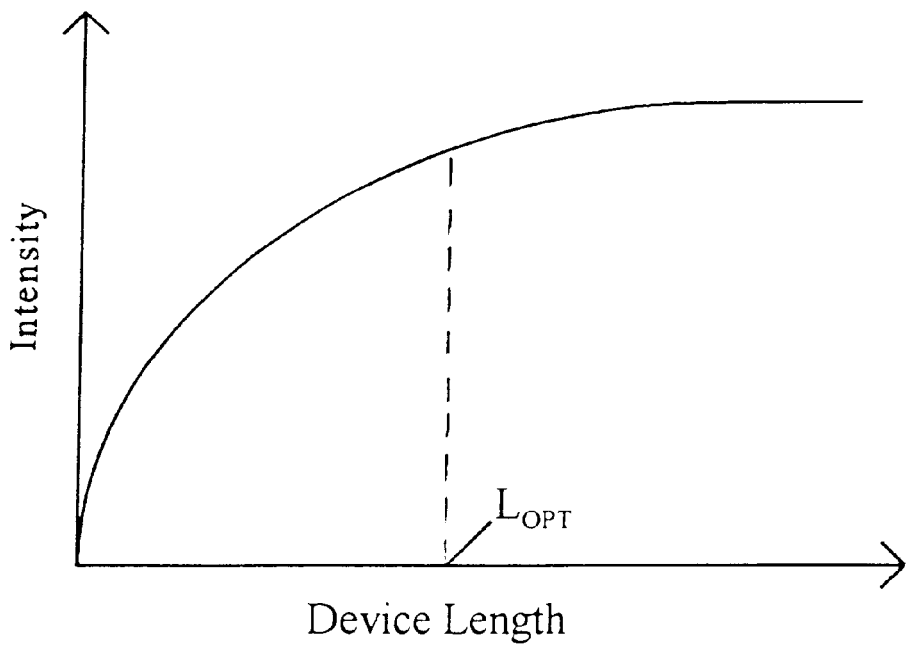
FIGS. 6A–6B graphically illustrate the effects of light emitting device length on emitted light intensity and device efficiency, respectively.
Figure 6B:
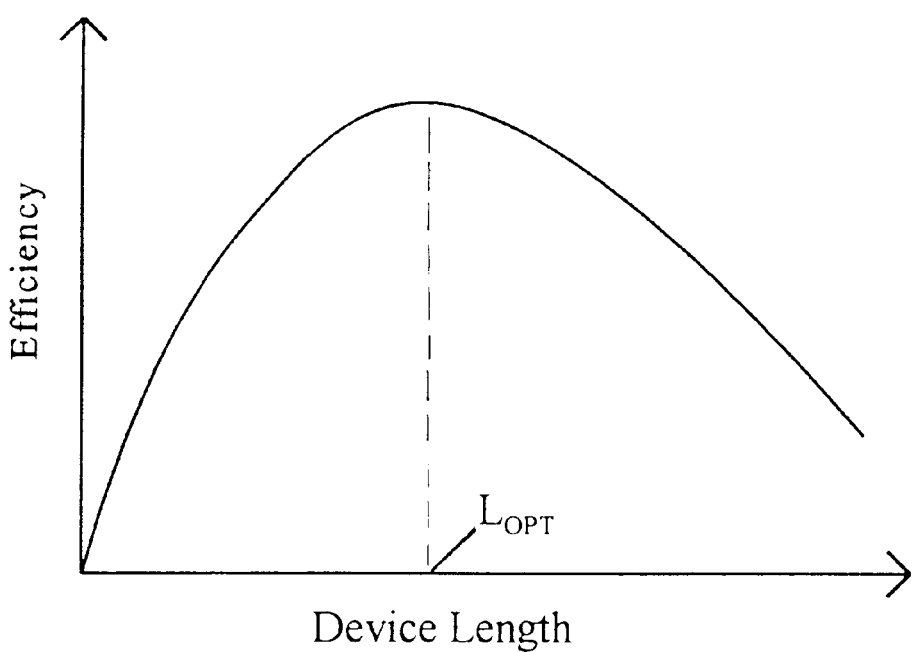

A significant advantage of the present invention is that the light generated by an OLED of a relatively large length is concentrated into a relatively small emission area. The result is a high brightness, high resolution light emitting device. As the length L of each device of the present invention increases, the efficiency of the device is expected to increase until some optimum length ($L_{OPT}$) is reached above which losses within the device become significant and efficiency therefore decreases. This phenomenon is graphically shown in FIG. 6. As such, the embodiment shown in FIG. 3, having two openings 115 in reflective layer 111 and converging light beams to focal point 120, is generally twice as bright as the embodiment shown in FIG. 2. The embodiment shown in FIG. 3 can thus be half the length of the embodiment shown in FIG. 2, but yet have the same resulting light intensity.

The high brightness light emission resulting from the devices of the present invention make such devices useful for xerography, copying, printing and display applications, and any other such applications where high brightness, monochromatic or multicolor light emission is required. Depending on the application, the embodiments as shown and described can be used singularly or as a plurality of pixels. For example, where the present invention is used to form a flat-panel linescan display device comprising a plurality of pixels, each light emitting device as herein described can represent an individual pixel or part thereof.

The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996); "Novel Materials for Multicolor LED's", Ser. No. 08/814,976 (filed Mar. 11, 1997, now abandoned); "Electron Transporting and Light Emitting Layers Based on Organic Free Radicals", Ser. No. 08/774,120 (filed Dec. 23, 1996, now U.S. Pat. No. 5,811,833); "Multicolor Display Devices", Ser. No. 08/772,333 (filed Dec. 23, 1996); "Red-Emitting Organic Light Emitting Devices (LED's)", Ser. No. 08/774,087 (filed Dec. 23, 1996); "Driving Circuit For Stacked Organic Light Emitting Devices", Ser. No. 08/792,050 (filed Feb. 3, 1997, now U.S. Pat. No. 5,757,139); "High Efficiency Organic Light Emitting Device Structures", Ser. No. 08/772,332 (filed Dec. 23, 1996, now U.S. Pat. No. 5,834,893); "Vacuum Deposited, Non-Polymeric Flexible Organic Light Emitting Devices", Ser. No. 08/789,319 (filed Jan. 23, 1997, now U.S. Pat. No. 5,844,363); "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997, now U.S. Pat. No. 5,917,280); "High Contrast Transparent Organic Light Emitting Device Display", Ser. No. 08/821,380 (filed Mar. 20, 1997, now U.S. Pat. No. 5,986,401); and "Organic Light Emitting Devices Containing A Metal Complex of 5-Hydroxy-Quinoxaline as A Host Material", Ser. No. 08/838,099 (filed Apr. 15, 1997, now U.S. Pat. No. 5,861,219), each co-pending application being incorporated herein by reference in its entirety. The subject invention may also be used in conjunction with the subject matter of each of co-pending U.S. patent application Ser. No. 08/354,674 (filed Dec. 13, 1994, now U.S. Pat. No. 5,707,745), Ser. No. 08/613,207 (filed Mar. 6, 1996, now U.S. Pat. No. 5,703,436), Ser. No. 08/632,322 (filed Apr. 15, 1996, now U.S. Pat. No. 5,757,026) and Ser. No. 08/693,359 and provisional patent application Serial Nos. 60/010,013, 60/024,001 and 60/025501, each of which is also incorporated herein by reference in its entirety.

Those with skill in the art may recognize various modifications to the embodiments of the invention described and illustrated herein. Such modifications are meant to be covered by the spirit and scope of the appended claims.

What is claimed is:

1. A light emitting device, said device comprising:

a transparent substrate;

a reflective layer on said substrate, said reflective layer having at least one opening therein;

a waveguiding layer on said reflective layer, said waveguiding layer having at least three sides; and an OLED on said waveguiding layer, said OLED emitting light of a predetermined color;

wherein the light emitted from said OLED is waveguided within said waveguiding layer and directed through said at least one opening in said reflective layer for emission through said substrate.

2. The light emitting device of claim 1, further comprising a ref lector on at least one of said at least three sides of said waveguiding layer.

3. The light emitting device of claim 2, wherein said reflector is curved in shape.

4. The light emitting device of claim 2, wherein said reflector is a metallic mirror.

5. The light emitting device of claim 3, wherein said reflector is made from the group consisting of aluminum, silver, magnesium-aluminum alloy, and combinations thereof.

6. The light emitting device of claim 2, wherein said reflector is a multilayer dielectric stack.

7. The light emitting device of claim 1, wherein said reflective layer is a multilayer dielectric stack.

8. The light emitting device of claim 1, further comprising an antireflection coating on said substrate at said at least one opening in said reflective layer.

9. The light emitting device of claim 1, wherein said OLED is a double heterostructure device.

10. The light emitting device of claim 9, wherein said OLED comprises a transparent anode layer, a hole transporting layer on said anode layer, an emission layer on said hole transporting layer, an electron transporting layer formed on said emission layer, and a reflective cathode layer on said emission layer.

11. The light emitting device of claim 10, wherein said transparent anode layer comprises indium-tin-oxide.

12. The light emitting device of claim 10, wherein said reflective cathode layer comprises a metal having a work function less than about four electron volts.

13. The light emitting device of claim 10, further comprising a layer of dielectric material between said transparent anode layer and said waveguiding layer, said dielectric material having a refractive index greater than said transparent anode layer.

14. The light emitting device of claim 13, wherein said transparent anode layer is indium-tin-oxide and said dielectric material comprises titanium dioxide.

15. The light emitting device of claim 13, wherein the refractive index of said waveguiding layer is greater than the refractive index of said dielectric material.

16. The light emitting device of claim 1, wherein said OLED is a single heterostructure device.

17. The light emitting device of claim 16, wherein said OLED comprises a transparent anode layer, a hole transporting layer on said anode layer, a multifunctional layer on said hole transporting layer, said multifunctional layer serving as an emission layer and an electron transporting layer, and a reflective cathode layer on said multifunctional layer.

18. The light emitting device of claim 17, wherein said transparent anode layer comprises indium-tin-oxide.

19. The light emitting device of claim 17, wherein said reflective cathode layer comprises a metal having a work function less than about four electron volts.

20. The light emitting device of claim 17, further comprising a layer of dielectric material between said transparent anode layer and said waveguiding layer, said dielectric material having a refractive index greater than said transparent anode layer.

21. The light emitting device of claim 20, wherein said transparent anode layer is indium-tin-oxide and said dielectric material comprises titanium dioxide.

22. The light emitting device of claim 20, wherein the refractive index of said waveguiding layer is greater than the refractive index of said dielectric material.

23. The light emitting device of claim 1, further comprising a layer of down conversion phosphor between said OLED and said waveguiding layer, said layer of down conversion phosphor converting said predetermined color to a different color.

24. The light emitting device of claim 1, wherein the refractive index of said waveguiding layer is greater than the refractive index of said substrate.

25. The light emitting device of claim 1, wherein one of said at least three sides of said waveguiding layer is at an angle of less than 900 with respect to said substrate and the remainder of said at least three sides of said waveguiding layer are perpendicular to said substrate.

26. The light emitting device of claim 25, wherein said reflective layer has one opening therein, said opening positioned directly beneath said side of said waveguiding layer that is at an angle of less than 90° with respect to said substrate.

27. The light emitting device of claim 25, wherein said angle is 45°.

28. The light emitting device of claim 1, wherein a plurality of said at least three sides of said waveguiding layer are at an angle of less than 90° with respect to said substrate and any remaining sides of said at least three sides of said waveguiding layer are perpendicular to said substrate.

29. The light emitting device of claim 28, wherein said reflective layer has a plurality of openings therein, each of said openings positioned directly beneath each of said plurality of said at least three sides of said waveguiding layer which are at an angle of less than 90° with respect to said substrate.

30. The light emitting device of claim 29, wherein the light emitted through said plurality of openings converges to a common focal point.

31. The light emitting device of claim 28, wherein said angle is 30°.

32. A light emitting device, said device comprising:
a transparent substrate;
a reflective layer on said substrate, said reflective layer having at least one opening therein;
a waveguiding layer on said reflective layer, said waveguiding layer having at least three sides; and
a plurality of OLEDs on said waveguiding layer, each of said plurality of OLEDs emitting light of a predetermined color;
wherein the light emitted from said plurality of OLEDs is waveguided within said waveguiding layer and directed through said at least one opening in said reflective layer for emission through said substrate.

33. The light emitting device of claim 32, further comprising a reflector on at least one of said at least three sides of said waveguiding layer.

34. A light emitting device, said device comprising:
a substrate, said substrate having at least one pit therein; and
a light emitter in said at least one pit, said light emitter comprising:
an OLED, said OLED emitting light of a predetermined color;
a waveguiding layer on said OLED, said waveguiding layer having at least three sides; and
a reflective layer on said waveguiding layer, said reflective layer having at least one opening therein;
wherein the light emitted from said OLED is waveguided within said waveguiding layer and directed through said at least one opening in said reflective layer for emission of light in a direction away from said substrate.

35. An electronic device incorporating the light emitting device of any one of claims 1, 32 or 34.

36. A computer incorporating the light emitting device of any one of claims 1, 32 or 34.

37. A television incorporating the light emitting device of any one of claims 1, 32 or 34.

38. A billboard or sign incorporating the light emitting device of any one of claims 1, 32 or 34.

39. A vehicle incorporating the light emitting device of any one of claims 1, 32 or 34.

40. A printer incorporating the light emitting device of any one of claims 1, 32 or 34.

41. A telecommunications device incorporating the light emitting device of any one of claims 1, 32 or 34.

42. A telephone incorporating the light emitting device of any one of claims 1, 32 or 34.

43. A copier incorporating the light emitting device of any one of claims 1, 32 or 34.

44. A pixel in a display, the pixel comprising:
a transparent substrate;
a reflective layer on said substrate, said reflective layer having at least one opening therein;
a waveguiding layer on said reflective layer, said waveguiding layer having at least three sides; and
an OLED on said waveguiding layer, said OLED emitting light of a predetermined color;
wherein the light emitted from said OLED is waveguided within said waveguiding layer and directed through said at least one opening in said reflective layer for emission through said substrate.

* * * * *